United States Patent
Park

(10) Patent No.: US 6,919,246 B2
(45) Date of Patent: Jul. 19, 2005

(54) SEMICONDUCTOR DEVICE AND FABRICATING METHOD THEREOF

(75) Inventor: Cheol Soo Park, Kyoungki-do (KR)

(73) Assignee: DongbuAnam Semiconductor Inc., Seoul (KR)

( * ) Notice: Subject to any disclaimer, the term of this patent is extended or adjusted under 35 U.S.C. 154(b) by 118 days.

(21) Appl. No.: 10/325,381

(22) Filed: Dec. 20, 2002

(65) Prior Publication Data

US 2003/0116797 A1 Jun. 26, 2003

(30) Foreign Application Priority Data

Dec. 24, 2001 (KR) .................................. 10-2001-0084008

(51) Int. Cl.[7] .......................................... H01L 21/8242
(52) U.S. Cl. ........................ 438/243; 438/212; 257/301
(58) Field of Search .............................. 438/243, 212; 257/300, 301, 302

(56) References Cited

U.S. PATENT DOCUMENTS

| | | | |
|---|---|---|---|
| 6,304,483 B1 | 10/2001 | Noble | |
| 6,355,529 B2 * | 3/2002 | Heo et al. | 438/270 |
| 6,432,774 B2 * | 8/2002 | Heo et al. | 438/270 |
| 6,437,388 B1 * | 8/2002 | Radens et al. | 257/301 |
| 6,449,186 B2 | 9/2002 | Noble | |
| 6,630,379 B2 * | 10/2003 | Mandelman et al. | 438/243 |

* cited by examiner

Primary Examiner—Thao P. Le
(74) Attorney, Agent, or Firm—Timothy J. Keefer; Seyfarth Shaw LLP

(57) ABSTRACT

A semiconductor device and method for fabricating the same. The semiconductor device comprises a capacitor including a semiconductor substrate having a first conductive type well; a first trench formed in the semiconductor substrate; a plate electrode formed on the first trench; a capacitor insulating film formed on the plate electrode; and a storage node electrode formed in the first trench. The transistor includes a first insulating film for planarization formed on the storage node electrode; a second trench formed in the portion of the first conductive type well, which does not correspond to the first trench; a gate insulating film formed on the second trench; a gate electrode formed on the portion of the gate insulating film, located on the second trench; and drain and source regions formed on the upper and lower portions of the first conductive type well, respectively, which corresponds to the sidewall of the second trench.

5 Claims, 4 Drawing Sheets

SEMICONDUCTOR DEVICE AND FABRICATING METHOD THEREOF

BACKGROUND OF THE INVENTION

1. Field of the Invention

The present invention relates to a semiconductor device and a fabricating method thereof. More particularly, the present invention relates to a semiconductor device and a method for fabricating the same, which has a capacitor of a dual trench structure, and a transistor of a vertical structure.

2. Description of the Prior Art

In realizing a SOC (System-on-a-Chip) design, if a capacitor and a transistor of a memory cell can be formed within a silicon substrate, it will provide many advantages to subsequent processes.

However, an existing transistor has a horizontal structure, and a gate electrode or a source/drain region in this transistor also has a horizontal structure. Thus, the existing transistor occupies large areas. Furthermore, in such a transistor, a minimum design rule is severely restricted, a fabricating process is complex, and device characteristics are not much improved.

SUMMARY OF THE INVENTION

Accordingly, the present invention has been made to solve the above-mentioned problems occurring in the prior art, and an object of the present invention is to provide a semiconductor device and a method for fabricating the same, in which a capacitor is disposed at the lower region of a vertical trench, and a transistor is disposed on the cylindrical inner wall of the trench, such that junction leakage current and junction capacitance can be minimized.

To achieve the above object, in one aspect, the present invention provides a semiconductor device comprising a capacitor and a transistor, in which the capacitor including: a semiconductor substrate having a first conductive type well formed therein; a first trench formed in the semiconductor substrate including the first conductive type well; a plate electrode formed on the surface of the first trench; a capacitor insulating film formed on the surface of the plate electrode; and a storage node electrode formed in the first trench including the capacitor insulating film; and the transistor including: a first insulating film for planarization formed over the storage node electrode; a second trench formed in the portion of the first conductive type well, which does not correspond to the first trench; a gate insulating film formed on the surface of the second trench; a gate electrode formed on the portion of the gate insulating film, which is located on the sidewall of the second trench; and drain and source regions formed on the upper and lower portions of the first conductive type well, respectively, which corresponded to the sidewall of the second trench.

In the semiconductor device according to the present invention, the capacitor is preferably formed in the semiconductor substrate at a portion below the first conductive type well, a storage node plug is formed between the first insulating film for planarization and the storage node electrode, and a storage node connector, which serves to connect the capacitor and the transistor to each other, is formed between the storage node plug and the source region.

Moreover, it is preferred for the semiconductor device of the present invention that the capacitor has a cylindrical structure, and the transistor has a vertical structure.

In another aspect, the present invention provides a method for fabricating a semiconductor device, which comprises the steps of: providing a semiconductor substrate having a first conductive type well formed therein; forming a first trench in the semiconductor substrate including the first conductive type well; forming a plate electrode on the surface of the first trench; forming a capacitor insulating film on the surface of the plate electrode; forming a storage node electrode in the first trench including the capacitor insulating film; forming a first insulating film for planarization over the storage node electrode; forming a second trench in the first conductive type well, which does not correspond to the first trench; forming a gate insulating film on the surface of the second trench; forming a gate electrode on the portion of the gate insulating film, which is located on the sidewall of the second trench; and forming drain and source regions on the upper and lower portions of the first conductive type well, respectively, which correspond to the sidewalls of the second trench.

In the method for fabricating the semiconductor device according to the present invention, the step of forming the first trench preferably comprises the sub-steps of: forming a pad oxide film and a first nitride film on the surface of the first conductive well; successively patterning the first nitride film, the pad oxide film and the first conductive well so as to form an initial trench; forming sacrificial oxide films on both sidewalls of the initial trench; forming a second nitride film between the sacrificial oxide films in the initial trench; removing the sacrificial oxide films; successively removing a portion of the first conductive type well and a portion of the semiconductor substrate below the first conductive type well, using the second and first nitride films as mask, thereby forming the first trench.

Preferably, the method for fabricating the semiconductor device according to the present invention further comprises the steps of: forming a storage node plug between the first insulating film for planarization and the storage node electrode; and forming an insulating buffer film on the surface of the storage node plug.

Furthermore, the method of fabricating the semiconductor device according to the present invention preferably further comprises the steps of: removing the insulating buffer film; and forming a storage node connector in a portion from which the insulating buffer film was removed. Also, the gate electrode is preferably is formed by forming a conductive layer on the entire structure including the second trench, and then selectively removing the conductive layer by anisotropic etching in such a manner that it remains only on the side of the second trench.

Moreover, the method for fabricating the semiconductor device according to the present invention further comprises the steps of: forming a second insulating film for planarization on the entire structure, after forming the source and drain regions; selectively removing the second insulating film for planarization so as to form contact holes through which the upper surface of the drain region and the upper surface of the gate electrode are exposed; and forming contact plugs in the contact holes, the contact plugs being connected to word lines and bit lines, respectively, at a subsequent process.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

A semiconductor device and a fabricating method thereof according to a preferred embodiment of the present invention will hereinafter be described in further detail with reference to the accompanying drawings.

FIGS. 1 to 8 are cross-sectional views, which illustrate a method for fabricating a semiconductor device according to a preferred embodiment of the present invention.

Figure 1:
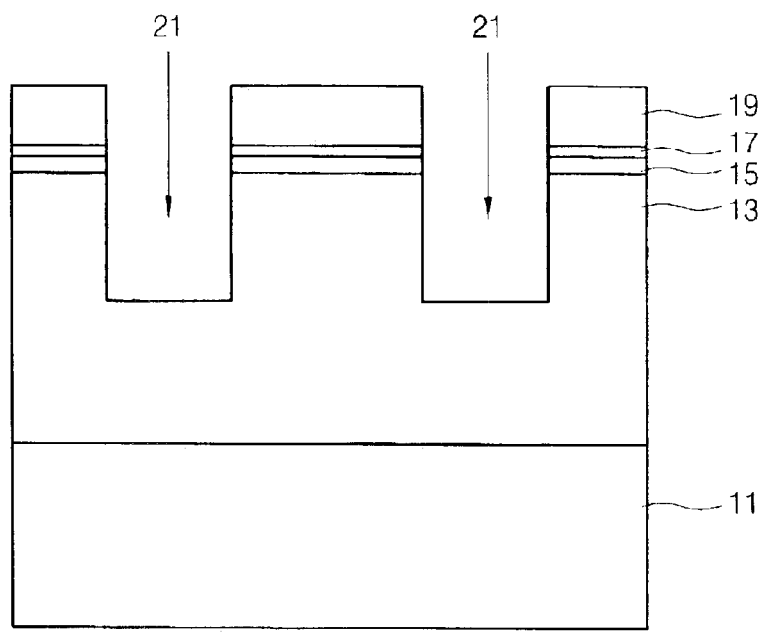
FIGS. 1 to 8 are cross-sectional views, which illustrate a method for fabricating a semiconductor device according to a preferred embodiment of the present invention.

As shown in FIG. 1, P-type impurity ions are first implanted into a semiconductor substrate 11 so as to form a P-type well 13.

Then, a pad oxide film 15 and a first nitride film 17 are deposited on the semiconductor substrate 11, after which a photoresist film (not shown) for forming a trench mask is applied on the first nitride film 17.

Thereafter, the photoresist film (not shown) is exposed to light and developed according to a photolithographic process, and selectively patterned so as to form a photoresist film pattern 19, which will be used as a mask for forming a trench.

Next, the first nitride film 17, the pad oxide film 15 and the semiconductor substrate 11 are successively patterned using the photoresist film pattern 19 as a mask, so that a first trench 21 is formed in the semiconductor substrate 11 to a fixed depth.

Figure 2:
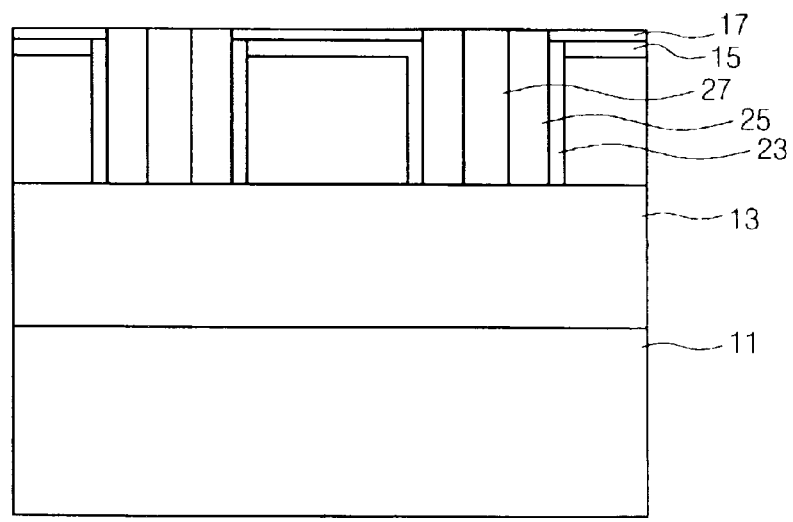

As shown in FIG. 2, the photoresist film pattern 19 is then removed, after which an oxidation process is carried out such that a first buffer oxide film 23 is formed on the surface of the first trench 21.

Then, a first oxide film 25 is deposited on the entire structure including the first buffer oxide film 23. Next, the first oxide film 25 is blanket etched by anisotropic dry etching until the upper surface of the first nitride film 17 is exposed. Thus, the first oxide film 25 is selectively removed such that it remains only on both sides of the first trench 21. At this time, the portion of the surface of the P-type well 13, which is located below the central portion of the first trench 21, is exposed.

After this, a second nitride film 27 is deposited on the entire structure and the inside of the trench 21 including the exposed portion of the P-type well 13. The second nitride film 27 is blanket etched by anisotropic dry etching such that it is selectively removed so as to remain only in the first trench 21.

Figure 3:
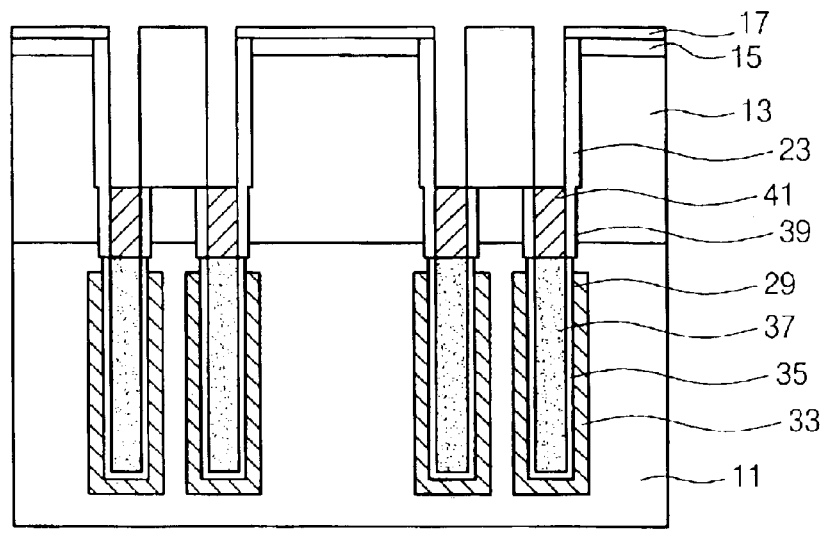

As shown in FIG. 3, the first oxide film 25 is then removed by a wet etching process. Next, using the first nitride film 17 and the second nitride film 27 as a hard mask, the semiconductor substrate 11 including the P-type well 13 is etched to a depth of several $\mu$m so as to allow a capacitor to be formed.

Thereafter, As- or phosphorus-doped LPTEOS is deposited on the entire structure including the second trench 29, and a photoresist film (not shown) is applied on the deposited LPTEOS film.

Then, the photoresist film (not shown) is dry etched to a depth of several hundreds of Angstroms from the upper surface of the P-type well. The exposed portion of LPTEOS, which remains on the photoresist film, is removed, followed by removing the photoresist film. An undoped oxide film is then deposited and annealed, thereby forming a plate electrode 33. Then, the doped LPTEOS and the undoped LPTEOS are removed.

Thereafter, a capacitor insulating film 35 and a polysilicon layer for forming a storage node electrode are successively deposited and etched back, thereby forming a storage node electrode 37. At this time, the storage node electrode 37 is formed in such a manner that it ends at the lower portion of the P-type well 13.

Then, a collar oxide film 39 is formed on the side of the second trench 29, and a conductive layer (not shown) for forming a storage node plug is deposited on the lower surface of the second trench 29, and is blanket etched back so as to form a storage node plug 41.

Figure 4:
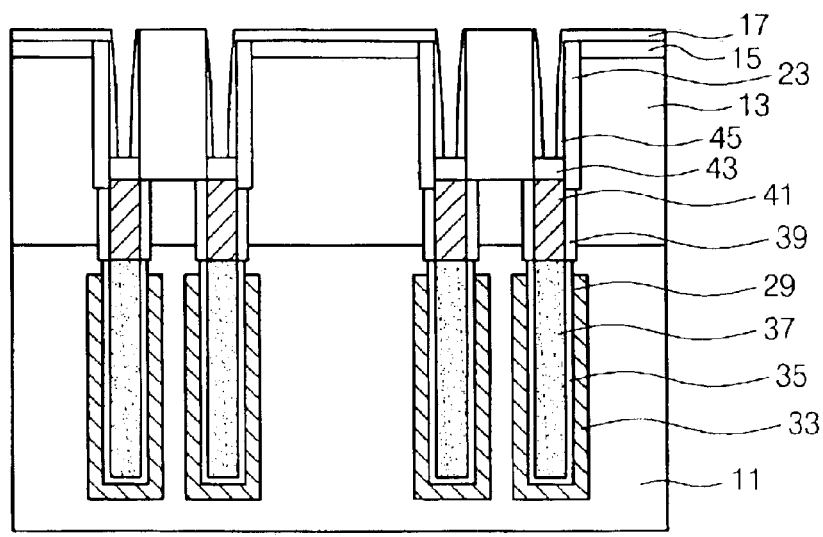

As shown in FIG. 4, a second insulating buffer film 43 is then deposited on the entire structure including the surface of the storage node plug 41, followed by etching back the second insulating buffer film 43. Next, a nitride film (not shown) is deposited on the entire structure, after which it is etched back so as to form a nitride spacer 45 on the side of the first trench 21.

Figure 5:
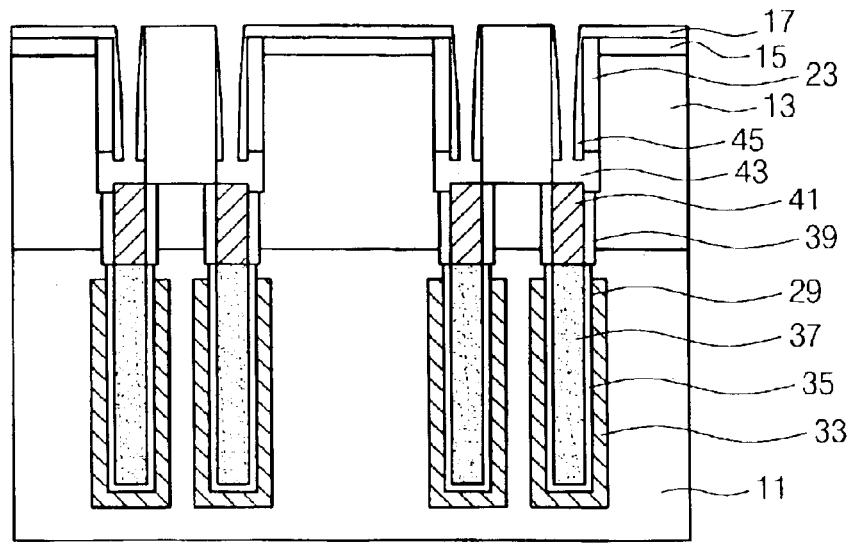

As shown in FIG. 5, the second insulating buffer film 43 is then removed by a wet etching process.

Figure 6:
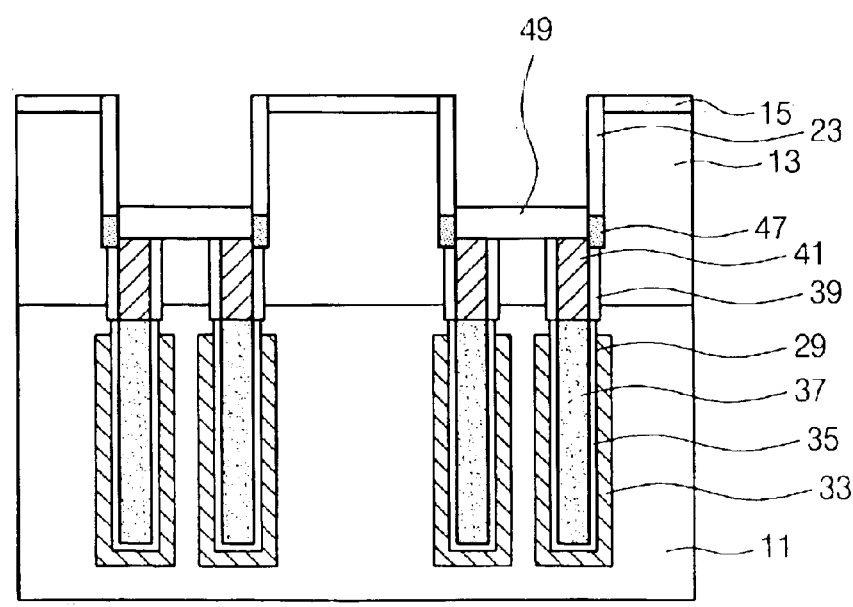

As shown in FIG. 6, a phosphorus-doped polysilicon layer (not shown) is then deposited on the entire structure, after which it is blanket etched by dry etching. Thus, a storage node connector 47, which will be electrically connected to a drain region (not shown) to be formed in a subsequent process, is formed on the portion of the side of the first trench 21, from which the second insulating buffer film 43 was removed. The storage node connector 47 is then etched back by a dry etching process.

Figure 7:
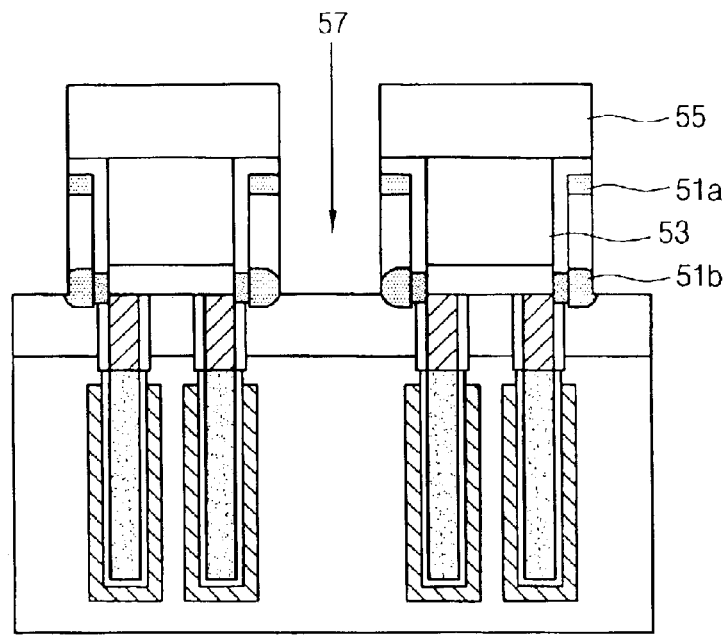

As shown in FIG. 7, a first insulation film for planarization 53 is then deposited on the entire structure, after which it is planarized by CMP treatment.

Next, impurity ions are implanted into the P-type well 13 so as to form a source region 51b and a drain region 51a.

Following this, a photoresist film (not shown) for forming a cell mask is applied on the entire structure including the first insulating film for planarization 53 is applied, and exposed to light and developed by a photolithographic process. The developed photoresist film (not shown) is patterned according to a selective etching process, thereby forming a photoresist film pattern 55.

Using the photoresist film pattern 55 as a cell mask, the portion of the pad oxide film 15 and the portion of the P-type well 13, which do not correspond to the first trench 21, are successively dry etched in such a manner that the portion of the drain 51a is exposed. Thus, a third trench 57 is formed.

Although not shown in drawings, the photoresist film pattern 55 is then removed, after which a sacrificial oxidation process is carried out such that a sacrificial oxide film (not shown) is formed on the surface of the third trench 57 in a thin layer. At this time, since the source region 51b and the drain region 51a were highly doped, the sacrificial oxide film is five to ten times thicker than the channel region.

Figure 8:
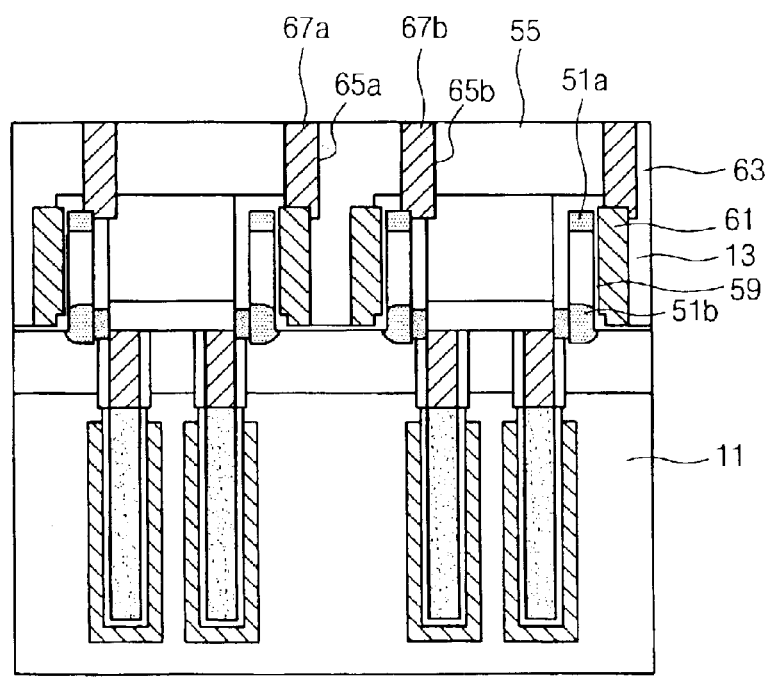

As shown in FIG. 8, a gate insulating film 59 and a conductive layer 61 for forming a gate electrode are then deposited on the entire structure including the fourth trench 57. Next, they are blanket etched by drying etching so as to form a gate electrode 61 on the sidewall of the third trench 57.

A second insulating film for planarization 63 is then deposited on the entire structure including the gate electrode 61, in a thick layer. Using bit and word line masks (not shown), the second insulating film 63 is then selectively patterned, so that a word line contact hole 65a and a bit line contact hole 65b, through which the drain region 51a and the gate electrode 61 are exposed, respectively, are formed.

Next, a conductive layer for forming plugs (not shown) is deposited on the second insulating film 63 including the word line contact hole 65a and the bit line contact hole 65b. This conductive layer (not shown) is blanket etched, so that a word line contact plug 67a and a bit line contact plug 67b are formed in the word line contact hole 65a and the bit line contact hole 65b, respectively.

Although not shown in drawings, a word line (not shown) and a bit line (not shown) are then formed on the word line contact plug 67a and the bit line contact plug 67b, respectively. Accordingly, a memory cell is fabricated.

The semiconductor device and the fabricating method thereof according to the present invention as described above have the following effects.

In the semiconductor device and the fabricating method thereof according to the present invention, the transistor of the vertical structure can be formed in the cylindrical trench, and at the same time, the capacitor of the cylindrical structure can be formed below the transistor of the vertical structure.

Particularly, the semiconductor device and the fabricating method thereof according to the present invention enable a vertical SOI device to be realized, such that the junction leakage current and junction capacitance of the SOI device can be minimized.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, which comprises the steps of:
   providing a semiconductor substrate having a first conductive type well formed therein;
   forming a first trench in the semiconductor substrate including the first conductive type well, wherein the step of forming the first trench preferably comprises the sub-steps of:
   forming a pad oxide film and a first nitride film on the surface of the first conductive well;
   successively patterning the first nitride film, the pad oxide film and the first conductive well so as to form an initial trench;
   forming sacrificial oxide films on both sidewalls of the initial trench;
   forming a second nitride film in the initial trench at a portion between the sacrificial oxide films;
   removing the sacrificial oxide films; and
   successively removing a portion of the first conductive type well and a portion of the semiconductor substrate below the first conductive type well, using the second and first nitride films as mask, thereby forming the first trench;
   forming a plate electrode on the surface of the first trench;
   forming a capacitor insulating film on the surface of the plate electrode;
   forming a storage node electrode in the first trench including the capacitor insulating film;
   forming a first insulating film for planarization over the storage node electrode; forming a second trench in the portion of the first conductive type well, which does not correspond to the first trench;
   forming a gate insulating film on the surface of the second trench;
   forming a gate electrode on the portion of the gate insulating film, which is located on the sidewall of the second trench; and
   forming drain and source regions on the upper and lower portions of the first conductive type well, respectively, which correspond to the sidewall of the second trench.

2. The method of claim 1, which further comprises the steps of:
   forming a storage node plug between the first insulating film and the storage node electrode; and
   forming an insulating buffer film on the surface of the storage node plug.

3. The method of claim 2, which further comprises the steps of:
   removing the insulating buffer film; and
   forming a storage node connector in a portion from which the insulating buffer film was removed.

4. The method of claim 3, in which the gate electrode is formed by forming a conductive layer on the entire structure including the second trench, and selectively removing the conductive layer by anisotropic etching in such a manner that it remains only on the side of the second trench.

5. The method of claim 1, which further comprises the steps of:
   forming a second insulating film for planarization on the entire structure, after forming the source and drain regions;
   selectively removing the second insulating film so as to form contact holes through which the upper surface of the drain region and the upper surface of the gate electrode are exposed; and
   forming contact plugs in the contact holes, the contact plugs being connected to a word line and a bit line, respectively, at a subsequent process.

* * * * *